(12) United States Patent
Chen et al.

(10) Patent No.: US 7,227,479 B1
(45) Date of Patent: Jun. 5, 2007

(54) DIGITAL BACKGROUND CALIBRATION FOR TIME-INTERLACED ANALOG-TO-DIGITAL CONVERTERS

(75) Inventors: Hsin-Hung Chen, Jhunan Township (TW); Jaesik Lee, Bridgewater, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/315,640

(22) Filed: Dec. 22, 2005

(51) Int. Cl.
*H03M 1/06* (2006.01)
(52) U.S. Cl. .............. 341/118; 341/120; 341/141; 341/155; 341/169; 341/170
(58) Field of Classification Search ............. 341/118, 341/120, 141
See application file for complete search history.

(56) References Cited

U.S. PATENT DOCUMENTS

| | | | | |
|---|---|---|---|---|
| 4,763,105 A | * | 8/1988 | Jenq | 341/120 |
| 4,958,139 A | * | 9/1990 | Hyatt | 341/139 |
| 4,968,988 A | * | 11/1990 | Miki et al. | 341/141 |
| 5,294,926 A | * | 3/1994 | Corcoran | 341/120 |
| 6,496,125 B2 | * | 12/2002 | Jonsson et al. | 341/118 |
| 6,545,626 B1 | * | 4/2003 | Nakada | 341/155 |
| 6,556,156 B1 | * | 4/2003 | Hungerbuehler | 341/120 |
| 6,771,203 B1 | * | 8/2004 | Nairn | 341/159 |
| 6,836,235 B2 | * | 12/2004 | Asami | 341/155 |
| 6,967,603 B1 | * | 11/2005 | Lin | 341/120 |
| 7,049,984 B2 | * | 5/2006 | Wood et al. | 341/120 |
| 7,049,994 B2 | * | 5/2006 | Tsujita | 341/16 |
| 7,126,511 B2 | * | 10/2006 | Draxelmayr et al. | 341/136 |
| 7,161,514 B2 | * | 1/2007 | Tamba | 341/120 |
| 2006/0176197 A1 | * | 8/2006 | McNeill et al. | 341/120 |

* cited by examiner

*Primary Examiner*—Khai M. Nguyen (57) ABSTRACT

The present invention provides for background calibration of a time-interleaved analog-to-digital converter (TIADC). In one embodiment, a background calibrator includes a TIADC having a parallel array of time-interleaved main signal processors, each main signal processor including an ADC connected to a corresponding output FIR filter. The background calibrator also includes an auxiliary signal processor having an ADC connected to at least one corresponding output FIR filter. Additionally, the background calibrator further includes a timing calibration circuit, wherein the timing calibration circuit is configured to select one of the main signal processors, exchange the auxiliary signal processor with the selected main signal processor in the TIADC and connect the selected main signal processor to the timing calibration circuit. In an alternative embodiment, the timing calibration circuit is further configured to reduce a timing mismatch of the selected main signal processor.

17 Claims, 6 Drawing Sheets

DIGITAL BACKGROUND CALIBRATION FOR TIME-INTERLACED ANALOG-TO-DIGITAL CONVERTERS

TECHNICAL FIELD OF THE INVENTION

The present invention is directed, in general, to analog-to-digital conversion and, more specifically, to an apparatus and method for calibrating time-interlaced analog-to-digital converters.

BACKGROUND OF THE INVENTION

The increasing interest in higher data rate communication applications requires high-speed and high-resolution analog-to-digital converters (ADCs). One way of achieving such ADCs is to employ a time-interleaved architecture. Time-interleaved architectures provide a benefit of increased sampling rate for an analog signal and may employ a broad spectrum of ADC technologies. However, this benefit is usually achieved at the expense of both larger semiconductor die area and power consumption.

Time-interleaved ADCs (TIADCs) also generally provide conversion-related errors due to mismatches among channel ADCs that occur in the areas of offset, gain and timing. These mismatches cause spurious components in the spectrum of the TIADC thereby generally degrading the signal-to-noise-and-distortion ratio (SNDR) of the TIADC. In particular, timing mismatch errors are a primary limiting factor and give rise to higher noise power in the overall output. Such timing mismatches have generally two different aspects. These include random sampling jitter and fixed periodic timing-skew among different channels. The use of sample-and-hold amplifiers reduces timing mismatch, but usually limits the overall throughput speed of the TIADC.

Accordingly, what is needed in the art is an enhanced way to correct timing errors inherent in the use of multiple ADCs in a time-interleaved architecture.

SUMMARY OF THE INVENTION

To address the above-discussed deficiencies of the prior art, various embodiments provide background calibrators. In one embodiment, the background calibrator includes a TIADC having a parallel array of time-interleaved main signal processors, each main signal processor including an ADC connected to a corresponding output FIR filter. The background calibrator also includes an auxiliary signal processor having an ADC connected to at least one corresponding output FIR filter. Additionally, the background calibrator further includes a timing calibration circuit, wherein the timing calibration circuit is configured to select one of the main signal processors, exchange the auxiliary signal processor with the selected main signal processor in the TIADC, and connect the selected main signal processor to the timing calibration circuit.

In an alternative embodiment, the timing calibration circuit is further configured to reduce a timing mismatch of the selected main signal processor based on interpolation quantities and timing mismatch operations defined for calibration of the auxiliary signal processor.

In another aspect, the present invention provides a method for calibrating a TIADC. The method includes selecting a main signal processor, which includes an ADC connected to a corresponding output FIR filter, from a parallel array of time-interleaved main signal processors in the TIADC. The method also includes exchanging an auxiliary signal processor, which includes an ADC connected to at least one corresponding output FIR filter, with the selected main signal processor for calibration and connecting the selected main signal processor for calibration. In an alternative embodiment, the method further includes reducing a timing mismatch of the selected main signal processor based on interpolation quantities and timing mismatch operations defined for calibration of the auxiliary signal processor.

The foregoing has outlined preferred and alternative features of various embodiments, so that those skilled in the art may better understand the detailed description of the invention that follows. Additional features of the embodiments will be described hereinafter that form the subject of the claims of the invention. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
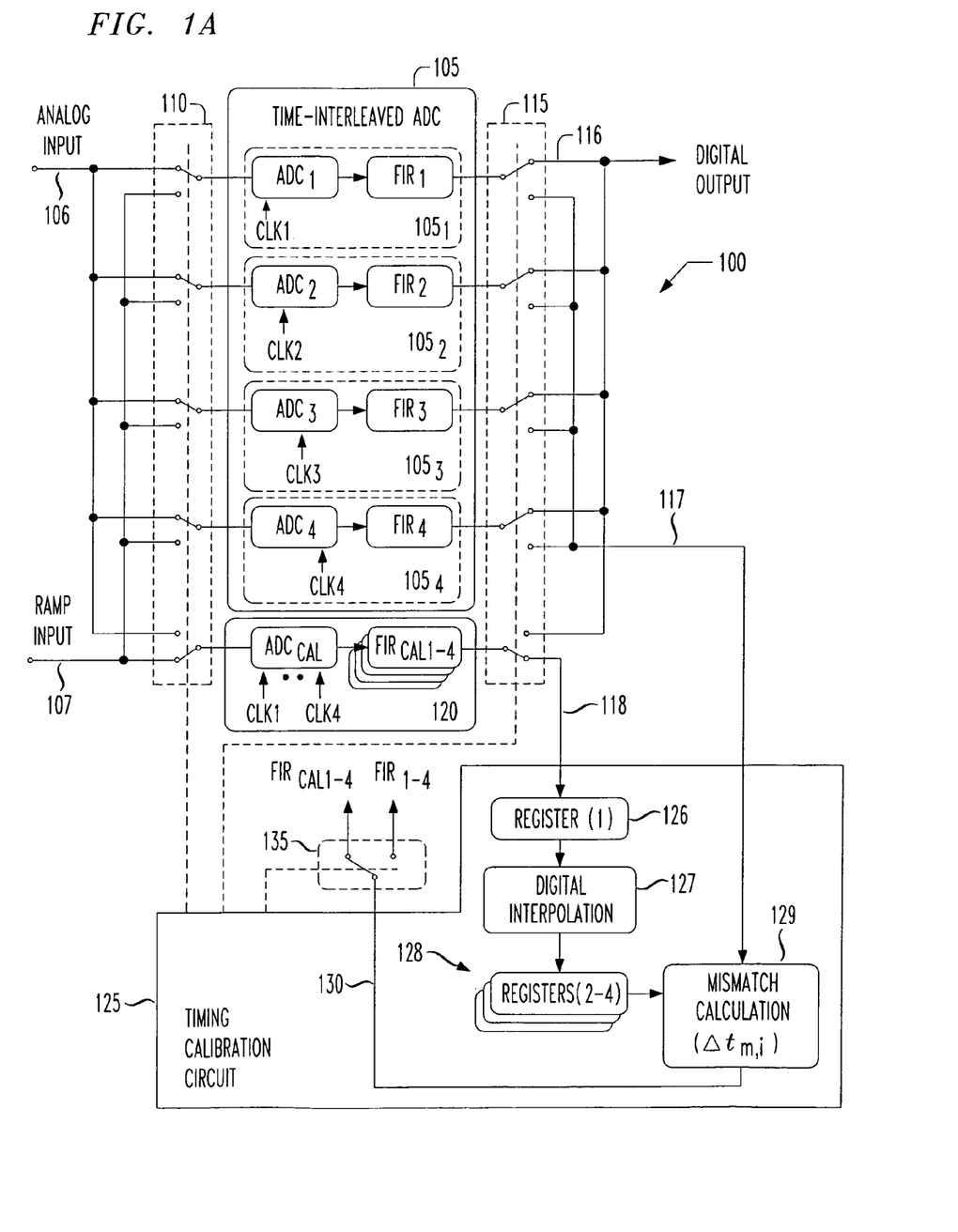
FIG. 1A illustrates a block diagram of an embodiment of a background calibrator constructed in accordance with the principles of the present invention.

Referring initially to FIG. 1A, illustrated is a block diagram of an embodiment of a background calibrator, generally designated 100, constructed in accordance with the principles of the present invention. The background calibrator 100 includes a time-interleaved analog-to-digital converter (TIADC) 105 coupled to input and output switch banks 110, 115, an auxiliary signal processor 120 also coupled to the input and output switch banks 110, 115 and a timing calibration circuit 125 coupled to the input and output switch banks 110, 115 and a filter coefficient switch 135.

In the illustrated embodiment, the TIADC 105 includes a parallel array of four main signal processors $105_1$–$105_4$, although generally, any plurality of such processors may be employed as appropriate to a particular application. Each of the main signal processors $105_1$–$105_4$ includes a main analog-to-digital converter (ADC) and a corresponding output FIR filter (i.e., $ADC_1$–$ADC_4$ and corresponding $FIR_1$–$FIR_4$). The auxiliary signal processor 120 includes a calibration ADC and four calibration output FIR filters (i.e., $ADC_{CAL}$ and corresponding $FIR_{CAL1-4}$).

Each first input pole of the input switch bank 110 is connected to an analog input signal bus 106, and each second input pole of the input switch bank 110 is connected to a ramp input signal bus 107. Similarly, each first output pole of the output switch bank 115 is connected to a digital output signal bus 116. Each second output pole of the output switch bank 115, associated with the main signal processors $105_1$–$105_4$, is connected to a mismatch calculation input 117 of the timing calibration circuit 125. Similarly, a second output pole of the output switch bank 115, associated with the auxiliary signal processor 120, is connected to an interpolation input 118 of the timing calibration circuit 125.

The timing calibration circuit 125 includes a first register 126 containing initial digitized data stored in a first register (1), a digital interpolation module 127, a register array 128 containing interpolated data stored in a second register (2), a third register (3) and a fourth register (4) and a mismatch calculation module 129 that provides a mismatch calculation output 130 connected to the filter coefficient switch 135.

The background calibrator 100 provides estimation and compensation of a fixed periodic timing mismatch among the parallel array of four main signal processors $105_1$–$105_4$. In the illustrated embodiment, estimation of timing mismatch requires the auxiliary signal processor 120 employing the additional calibration $ADC_{CAL}$ and the four calibration output FIR filters $FIR_{CAL1-4}$. The calibration filters $FIR_{CAL1-4}$ are employed to correct the timing errors. As will be shown in a subsequent discussion, the proposed calibration technique can significantly improve the signal-to-noise-and-distortion ratio (SNDR) performance for the TIADC 105.

The background calibrator 100 employs switch positions shown in FIG. 1A for the input and output switch banks 110, 115 and the filter coefficient switch 135 to provide needed digital interpolation and compensation parameters. During an initial calibration phase, an input ramp signal is connected to the compensation $ADC_{cal}$ and corresponding filter $FIR_{CAL1}$, while employing a first sampling clock $clk_1$, wherein digitized calibration data are stored into the first register (1). The digital interpolation circuit 127 follows the first register (1) and employs the digitized calibration data of register (1) to estimate the next quantized data corresponding to different-phase sampling clocks (i.e., second, third and fourth sampling clocks $clk_{2-4}$). The four sampling clocks $clk_{1-4}$ approximately occupy zero, 90, 180 and 270 degrees of phase shift in the sampling period for the four stages of TIADC 105.

Figure 2:
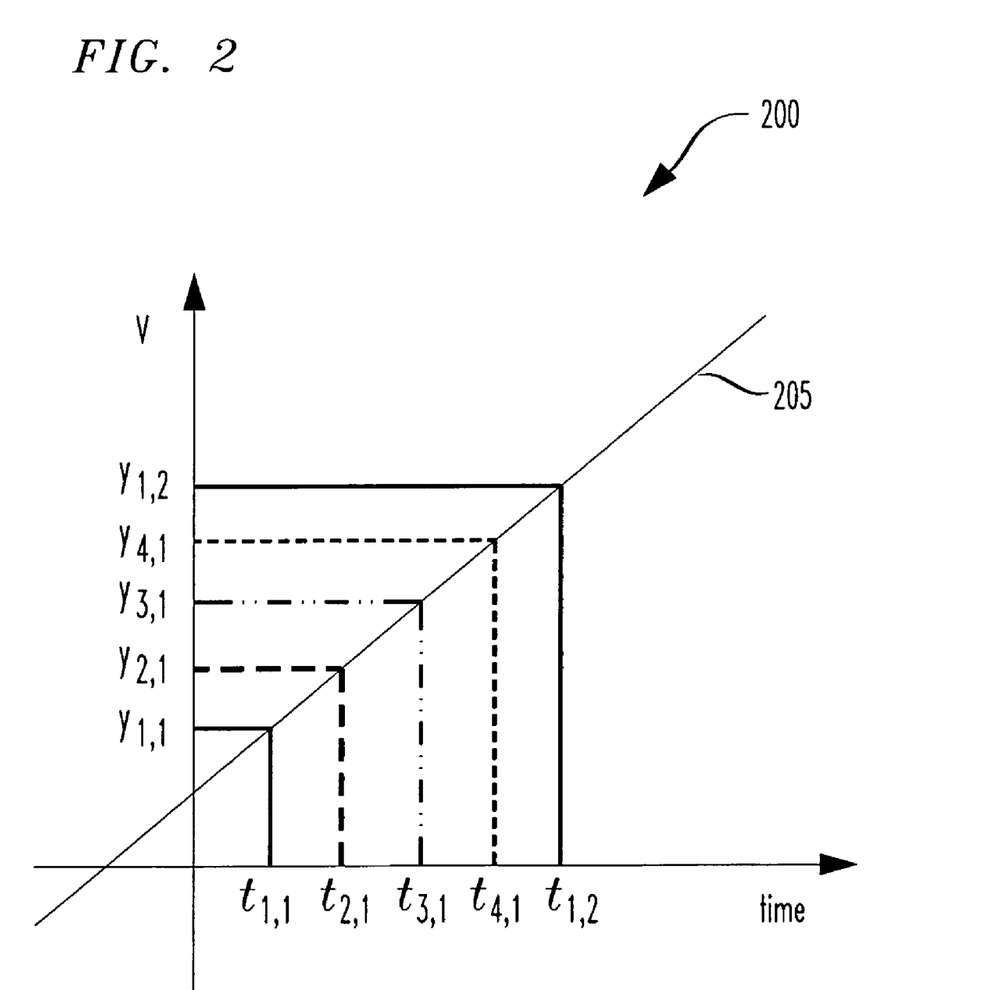
FIG. 2 illustrates an embodiment of an interpolation chart constructed in accordance with the principles of the present invention.

Turning momentarily to FIG. 2, illustrated is an embodiment of an interpolation chart, generally designated 200, constructed in accordance with the principles of the present embodiment. The interpolation chart 200 shows digital data samples and estimates for the calibration $ADC_{CAL}$ having an input ramp signal and employing the four sampling clocks $clk_{1-4}$.

The interpolation operation employs an interpolation function $y_{i,m}$, which may be defined as the $m^{th}$ sample of the calibration $ADC_{cal}$ with a sample clock i, (i=1–4). Then, first and second samples $y_{1,1}$ and $y_{1,2}$ may be seen, for the first sampling clock $clk_1$ at sample times $t_{1,1}$ and $t_{1,2}$, respectively, in the interpolation chart 200.

After employing the calibration $ADC_{cal}$ to collect digital data with the first sampling clock $clk_1$, a mean function associated with the digital interpolation module 127 may be employed to estimate the digital data associated with the calibration $ADC_{cal}$ using the second, third and fourth sampling clocks $clk_{2-4}$. Effectively, reference data stored in register (1) is employed while sequentially using sampling clocks $clk_{2-4}$ for the calibration $ADC_{cal}$ to sample the ramp input signal 105. This action yields interpolation values $y_{3,1}$ at $t_{3,1}$, $y_{2,1}$ at $t_{2,1}$ and $y_{4,1}$ at $t_{4,1}$, respectively.

In general, these interpolation values may be defined between samples as shown in equations (1a)–(1c) below:

$$y_{3,m} = \frac{y_{1,m} + y_{1,m+1}}{2}, \tag{1a}$$

$$y_{2,m} = \frac{y_{1,m} + y_{3,m}}{2}, \text{ and} \tag{1b}$$

$$y_{4,m} = \frac{y_{3,m} + y_{1,m+}}{2}. \tag{1c}$$

Referring again to FIG. 1A, the interpolated data is then stored in the register array 128 employing the second, third and fourth registers (2)–(4). The interpolated data are regarded as ideal sampled data of the calibration $ADC_{cal}$ and provide sampled data for ideal clock positions of zero, 90, 180 and 270 degrees having no timing errors. As a consequence, the interpolated data in the registers (1)–(4) are used for calibration as reference data.

Then, in a next calibration phase, the calibration $ADC_{cal}$ samples the input ramp signal employing the second, third and fourth sampling clocks $clk_{2-4}$. Output data are compared with the reference data in registers (2)–(4) and adjustments are made to the coefficients of $FIR_{CAL2-4}$ employing the mismatch calculation module 129 and the mismatch calculation output 130.

The errors between actual sampled data and the reference data in registers (1)–(4) come from timing errors. In the illustrated embodiment, the timing errors may be calculated employing the mismatch calculation module 129 according to equation (2) below.

$$\Delta t_{i,m} = \frac{y_{i,m}^* - y_{i,m}}{S}, \tag{2}$$

where $\Delta t_{i,m}$ is the timing error of $clk_i$ (i=2–4) relative to $clk_1$, S is the slope of the ramp signal, $y_{i,m}^*$ is the measured digital data and $y_{i,m}$ is the interpolated register data. Adjustments are made to the coefficients of $FIR_{CAL2-4}$ until the sample timing errors are reduced below a preselected threshold.

FIR filters typically introduce delays of many sample periods. However, FIR filters may also introduce fractional sample-period delays when sample time errors between interleaved main signal processors exist. These fractional delays may be both positive and negative depending on the filter coefficients employed. This principle is employed to compensate for timing mismatches between the main signal processors of the TIADC 105. A more detailed explanation of employing FIR filters to compensate for timing errors may be seen in "A 10-b 120-Msample/s Time-Interleaved Analog-to-Digital Converter With Digital Background Calibration", by Shafiq M. Jamal, et al., IEEE Journal Of Solid-State Circuits, Vol. 37, No. 12, December 2002, which is incorporated herein by reference.

Figure 1B:
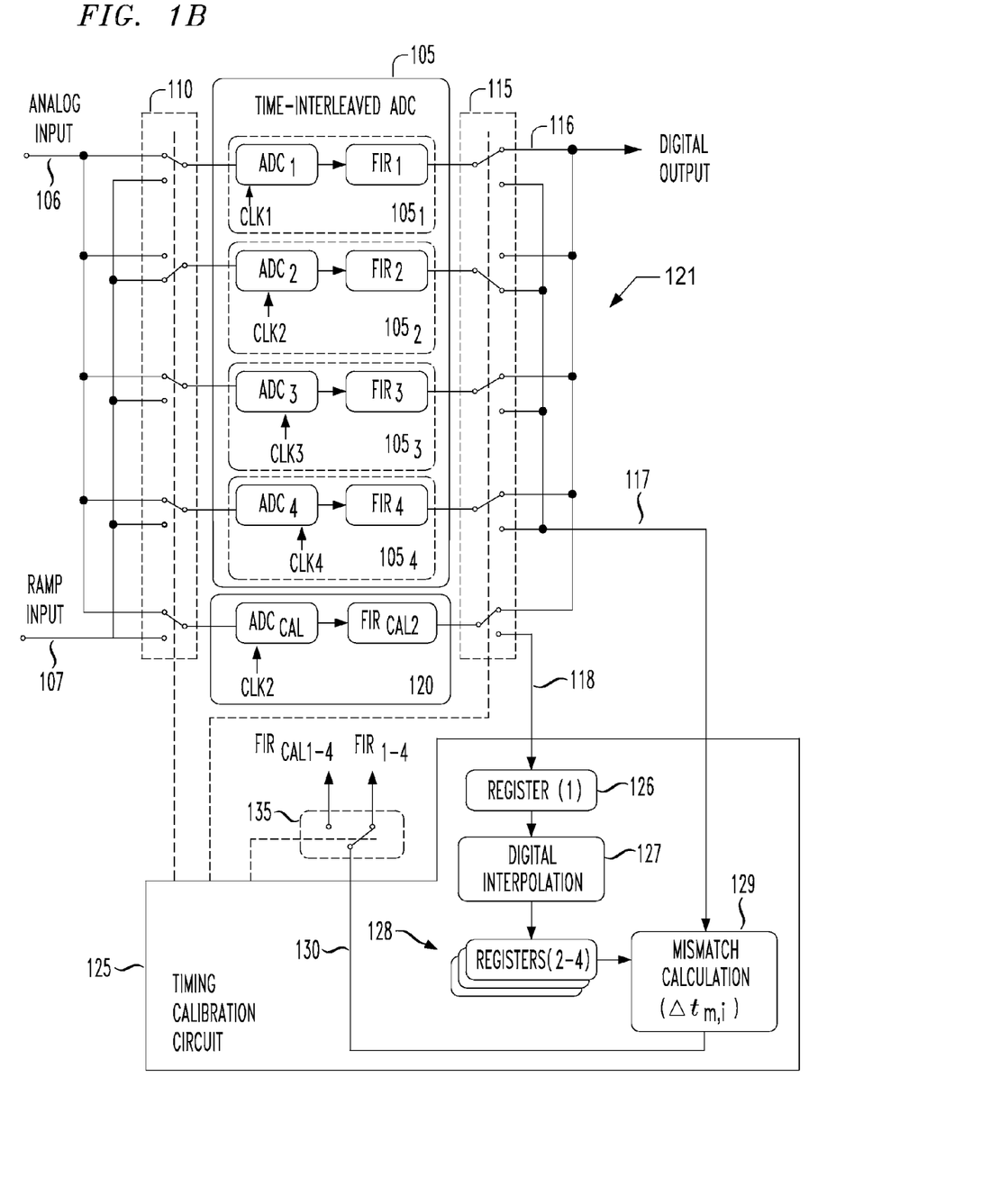
FIG. 1B illustrates an alternative connection of the background calibrator of FIG. 1A constructed in accordance with the principles of the present invention.

Turning now to FIG. 1B, illustrated is an alternative connection of the background calibrator of FIG. 1A, generally designated 121, constructed in accordance with the principles of the present invention. The background calibrator 121 shows the auxiliary signal processor 120 being substituted for one of the main signal processors (the second main signal processor $105_2$, as exemplary) while it is being calibrated. In this example, the auxiliary signal processor 120 is connected between the analog input signal bus 106 and the digital output signal bus 116 while employing the second sampling clock $clk_2$ to allow normal operation of the TIADC 105. Correspondingly, the second main signal processor $105_2$ is connected to the ramp input signal bus 107 and the mismatch calculation 117 to allow its calibration.

After minimizing the sampling time errors of the calibration $ADC_{cal}$ as was discussed with respect to FIG. 1A, a final calibration is carried out for each of the main $ADC_1$–$ADC_4$ (i.e., main $ADC_i$). This calibration phase again employs the timing calibration circuit 125 as discussed with respect to FIG. 1A. Again, the relative timing mismatches of the four main ADCs relative to the references of the timing calibration circuit 125 are reduced below a preselected threshold by adjusting the coefficients of the corresponding FIR filter (i.e., $FIR_i$) associated with each main $ADC_i$. Once this is accomplished, the input and output connections may again be employed as depicted in FIG. 1A.

Figure 3:
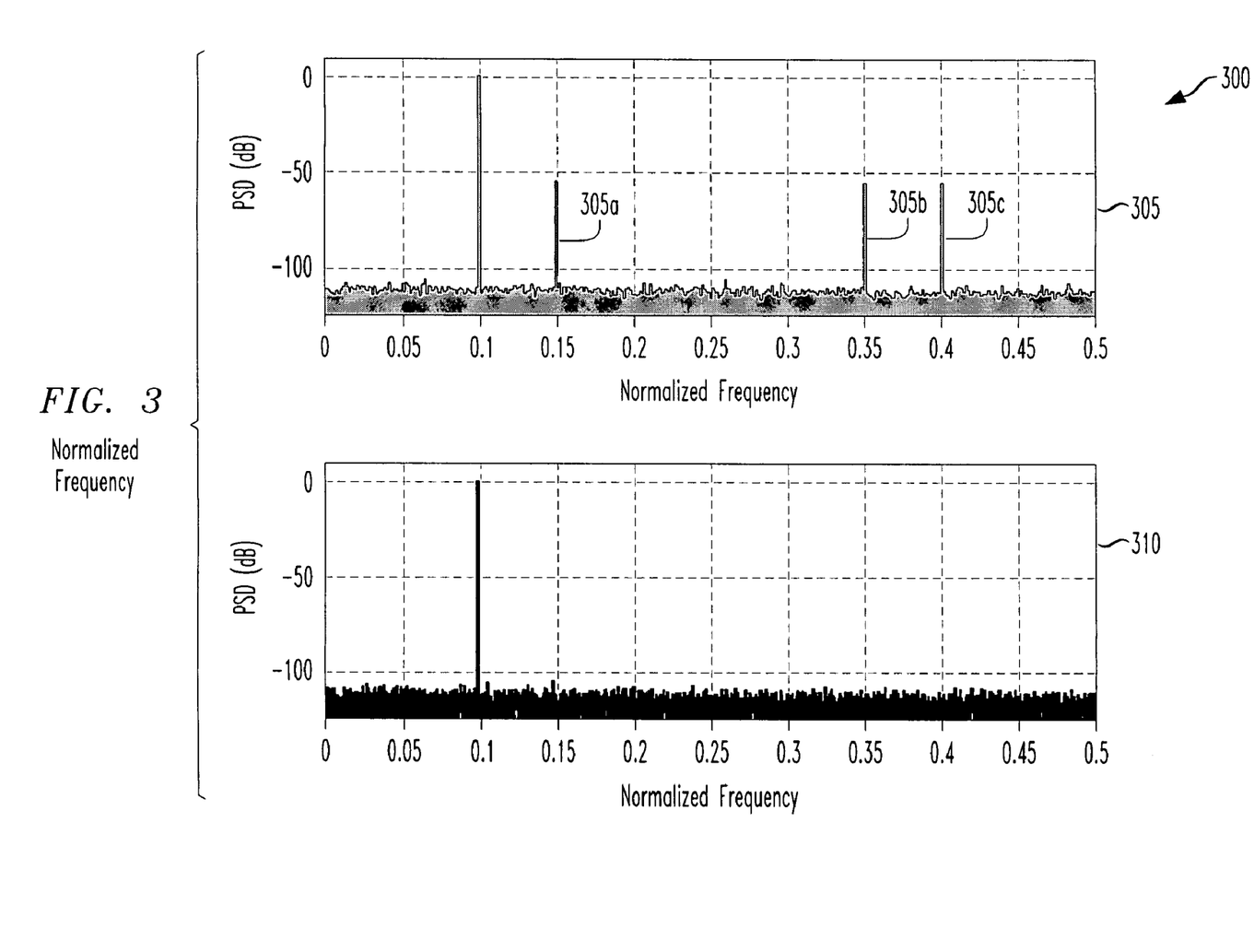
FIG. 3 illustrates a power spectral density diagram associated with a TIADC as was discussed with respect to FIGS. 1A and 1B.

Turning now to FIG. 3, illustrated is a power spectral density diagram, generally designated 300, associated with a TIADC as was discussed with respect to FIGS. 1A and 1B. The diagram 300 includes an uncalibrated output power spectral density (PSD) 305 and a calibrated output PSD 310. The uncalibrated output PSD 305 shows spurious responses 305a, 305b, 305c associated with timing errors before calibration. The calibrated output PSD 310 shows the output spectrum after calibration as carried out in accordance with the principles of the present invention.

A TIADC using four time-interleaved channels of 12-bit ADCs was employed to demonstrate the benefits of compensation provided by an embodiment for periodic timing-mismatch conditions. The number of filter taps needed in the corresponding FIR filters is mainly dependent on the required ADC resolution and the amount of sample timing error encountered. For 12-bit resolution, a FIR filter having 45-taps is employed for timing error correction in each of the main ADCs. This accommodates a fixed timing mismatch error of about one percent of sampling time among the time-interleaved phase generation paths.

The uncalibrated output PSD 305 shows the output spectrum of the TIADC without timing calibration. The input signal frequency is $f_{in}=0.1*f_s$, where $f_s$ is the sampling frequency. The spurious responses 305a, 305b, 305c, due to the timing mismatch, appear at normalized frequencies of $$\pm f_{in} + \frac{m}{4}f_s, \quad m = 1, 2, 3.$$

The calibrated output PSD 310 shows the benefits of calibration. The magnitude of the spurious response has been suppressed by about 50 dB, which is enough suppression to provide a clear spectrum for the 12-bit TIADC.

Figure 4:
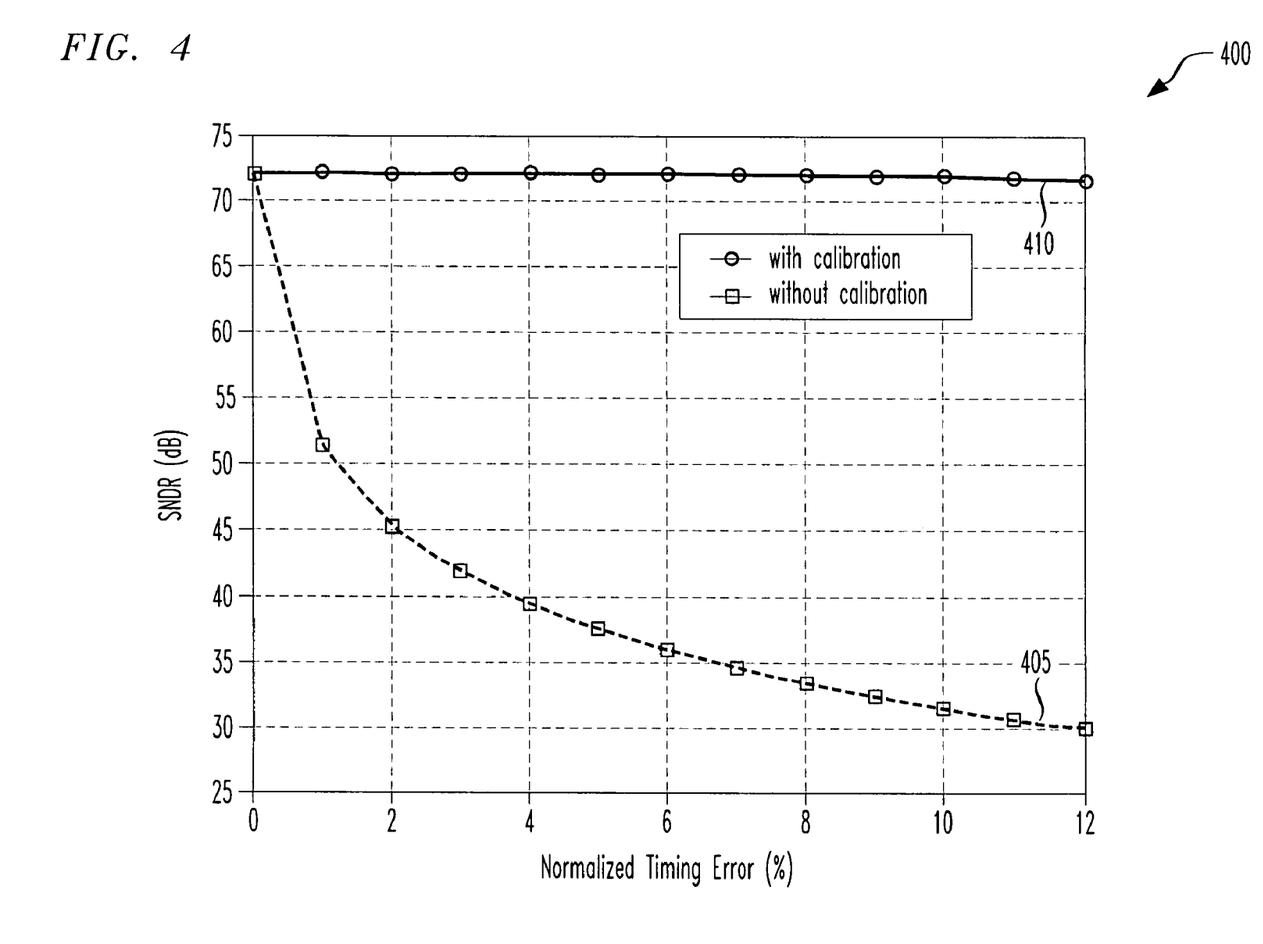
FIG. 4 illustrates an SNDR chart showing uncalibrated and calibrated responses for a TIADC system constructed in accordance with the principles of the present invention.

Turning now to FIG. 4, illustrated is an SNDR chart, generally designated 400, showing uncalibrated and calibrated responses for a TIADC system constructed in accordance with the principles of the present invention. The SNDR chart 400 includes an uncalibrated SNDR curve 405 and a calibrated SNDR curve 410 for normalized timing errors. For the uncalibrated SNDR curve 405, the SNDR may be seen to drop exponentially as timing error increases thereby demonstrating an SNDR of only about 30 dB at a normalized timing error of about 12 percent. Alternatively, the calibrated SNDR curve 410, showing the effect of calibration, provides an almost flat SNDR of greater than 70 dB for a normalized timing error up to about 12.

Figure 5:
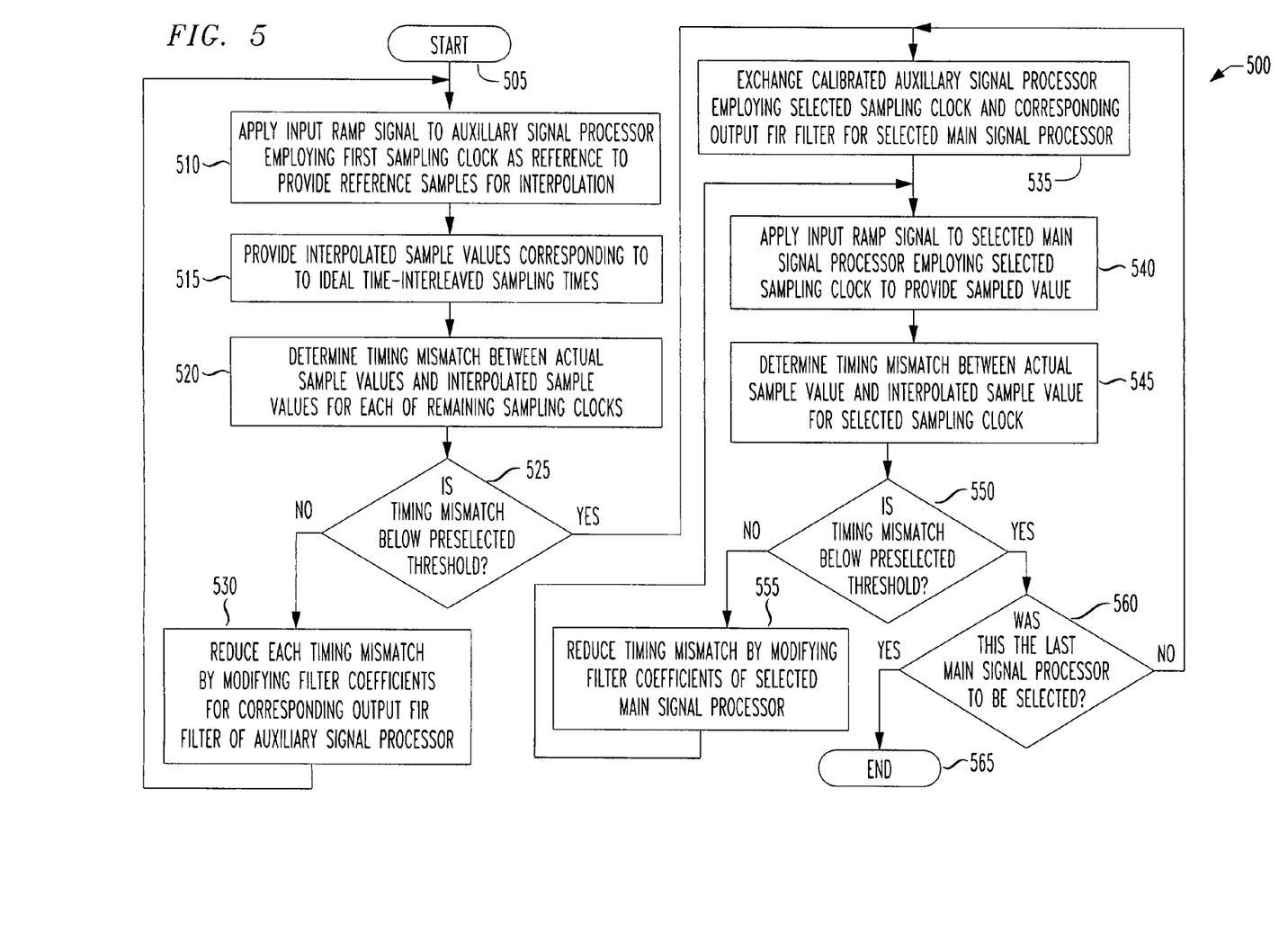
FIG. 5 illustrates a flow diagram of an embodiment of a method for calibrating a TIADC carried out in accordance with the principles of the present invention.

Turning now to FIG. 5, illustrated is a flow diagram of an embodiment of a method for calibrating a TIADC, generally designated 500, which may be used, for example, for calibrating the TIADC of FIG. 1A or FIG. 1B. The method 500 is for use with a parallel array of main signal processing ADCs and corresponding FIR filters employed in a time-interleaved manner. Additionally, the method uses an auxiliary signal processor having an ADC that is also connected to a parallel plurality of output FIR filters, wherein each of these output FIR filters corresponds to one of the main output FIR filters. The auxiliary signal processor may be employed to achieve a background calibration mode of operation.

The method 500 starts in a step 505. In a step 510, the method 500 involves applying an input ramp signal to the auxiliary signal processor that employs a first sampling clock as a reference clock. This provides samples of the input ramp voltage that serve as reference samples for interpolation. Then, in a step 515, the method 500 involves providing sample values that interpolate between two of the reference samples and correspond to ideal time-interleaved sampling times for the remaining number of sampling clocks employed in the TIADC. These interpolated sample values may be employed as reference data, because the ideal time-interleaved sampling times have no timing errors with respect to the first sampling clock.

The auxiliary signal processor then employs each of the remaining sampling clocks, in turn, to provide actual sample values of the input ramp signal. In a step 520, the method 500 involves determining a timing mismatch between the actual sample values and the interpolated sample values for each of the remaining sampling clocks. Then, in a first decisional step 525, the method 500 involves further determining whether the timing mismatch, which was determined in the step 520, is below a preselected threshold. If the timing mismatch is not below the preselected threshold, the method 500 includes reducing the timing mismatch by modifying filter coefficients of the output FIR filter being employed with the auxiliary signal processor for the selected remaining sampling clock. Then, the method 500 includes returning to the step 510 and repeating the steps until the timing mismatches for all of the remaining sampling clocks are below the preselected threshold.

Upon completing of the calibration of the auxiliary signal processor employing all sampling clocks, the method 500 involves exchanging the calibrated auxiliary signal processor for a selected main signal processor, in a step 535. The auxiliary signal processor employs the sampling clock and calibrated output FIR filter that corresponds to the sampling clock and output FIR filter of the selected main signal processor in the exchange. This allows the selected main signal processor to be calibrated in a background mode while the TIADC continues to be fully functional.

Then, in a step 540, the method 500 includes applying the input ramp signal to the selected main signal processor, while employing its regular sampling clock and output FIR filter, to provide an actual sample value. In a step 545, the method 500 involves determining the timing mismatch between the actual sample value and the corresponding interpolated value. In a second decisional step 550, the method 500 further involves determining whether the timing mismatch is below the preselected threshold. If it is not below the preselected threshold, the timing mismatch is reduced by modifying the filter coefficients of the selected output FIR filter.

The method 500 involves returning to the step 540 and executing the steps 540–550 until the remaining timing mismatch is below the preselected threshold. In response to the mismatch being below the threshold, the method 500 involves performing a third decisional step 560 to determine whether the last main signal processor has been selected for calibration. If the last main signal processor has not been selected, the previously selected and now calibrated main signal processor is returned to the TIADC, and the method 500 involves returning to the step 535. Here, the calibrated auxiliary signal processor is exchanged for another selected main signal processor, which is to be calibrated. This sequence continues until it is determined in the third decisional step 560 that the last main signal processor has been calibrated, wherein the method 500 ends in a step 565.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a background calibrator and a method for calibrating a time-interleaved analog-to-digital converter (TIADC) have been presented. Advantages include a reduction of fixed periodic timing mismatch effects in the TIADC. The compensation utilizes FIR filters to correct the timing errors. The signal-to-noise-and-distortion ratio (SNDR) performance for a 12-bit TIADC system was shown to be significantly enhanced by the calibrator and the method.

Although the present invention has been described in detail, those skilled in the art should understand that they can make various changes, substitutions and alterations herein without departing from the spirit and scope of the invention in its broadest form.

What is claimed is:

1. An apparatus, comprising:
   a time-interleaved analog-to-digital converter (TIADC) including a parallel array of time-interleaved main signal processors, each main signal processor including an analog-to-digital converter (ADC) connected to a corresponding output finite impulse response (FIR) filter;
   an auxiliary signal processor including an ADC connected to at least one corresponding output FIR filter;
   a timing calibration circuit; and
   wherein said timing calibration circuit is configured to select one of said main signal processors, exchange said auxiliary signal processor with said selected main signal processor in said TIADC, and connect said selected main signal processor to said timing calibration circuit.

2. The apparatus of claim 1, wherein said timing calibration circuit is further configured to reduce a timing mismatch of said selected main signal processor based on interpolation quantities and timing mismatch operations defined for calibration of said auxiliary signal processor.

3. The apparatus of claim 1, wherein said timing calibration circuit is further configured to apply an input ramp voltage and employ a first sampling clock as a reference clock during calibration of said auxiliary signal processor to provide reference samples for interpolation.

4. The apparatus of claim 1, wherein said timing calibration circuit is further configured to provide interpolated sample values, corresponding to ideal time-interleaved sampling times, between reference samples of said auxiliary signal processor.

5. The apparatus of claim 1, wherein said timing calibration circuit is further configured to determine timing mismatches between actual time-interleaved sampling times and corresponding ideal time-interleaved sampling times.

6. The apparatus of claim 5, wherein said timing calibration circuit is configured to reduce said timing mismatches by modifying filter coefficients of said corresponding output FIR filters.

7. The apparatus of claim 5, wherein said timing calibration circuit is configured to reduce said timing mismatches to a level below a preselected threshold.

8. A method for calibrating a time-interleaved analog-to-digital converter (TIADC), comprising:
   selecting a main signal processor, which includes an analog-to-digital converter (ADC) connected to a corresponding output finite impulse response (FIR) filter from a parallel array of time-interleaved main signal processors in said TIADC;
   exchanging an auxiliary signal processor, which includes an ADC connected to at least one corresponding output FIR filter, with said selected main signal processor; and
   connecting said selected main signal processor for calibration.

9. The method of claim 8 further comprising reducing a timing mismatch of said selected main signal processor based on interpolation quantities and timing mismatch operations defined for calibration of said auxiliary signal processor.

10. The method of claim 8 further comprising applying an input ramp voltage and employing a first sampling clock as a reference clock during calibration of said auxiliary signal processor to provide reference samples for interpolation.

11. The method of claim 8 further comprising providing interpolated sample values corresponding to ideal time-interleaved sampling times between reference samples of said auxiliary signal processor.

12. The method of claim 8 further comprising determining timing mismatches between actual time-interleaved sampling times and corresponding ideal time-interleaved sampling times.

13. The method of claim 12 including reducing said timing mismatches by modifying filter coefficients of said corresponding output FIR filters.

14. The method of claim 12 including reducing said timing mismatches to a level below a preselected threshold.

15. An apparatus, comprising:
   a timing calibration circuit; and
   a time-interleaved analog-to-digital converter (TIADC) including a parallel array of first signal processors, each first signal processor including an analog-to-digital converter (ADC) and a corresponding finite impulse response (FIR) filter; and
   wherein said timing calibration circuit is configured to apply a ramp voltage to one of said signal processors and to determine a timing mismatch of said one of said signal processors based on an output signal from said one of said signal processors in response to said applied ramp voltage.

16. The apparatus of claim 15, wherein said timing calibration circuit is configured to individually apply said ramp voltage to each one of said signal processors.

17. The apparatus of claim 16, wherein said timing calibration circuit is configured to determine a timing mismatch by digitally interpolating said output signal of said one of said signal processors.

* * * * *